United States Patent [19]

Suzuki

[11] 4,184,187
[45] Jan. 15, 1980

[54] UNBALANCED DC VOLTAGE DETECTING CIRCUIT

[75] Inventor: Tadao Suzuki, Tokyo, Japan

[73] Assignee: Sony Corporation, Tokyo, Japan

[21] Appl. No.: 926,030

[22] Filed: Jul. 19, 1978

[30] Foreign Application Priority Data

Jul. 28, 1977 [JP] Japan .................................. 52-90641

[51] Int. Cl.² ............................................. H02H 3/20
[52] U.S. Cl. ................................... 361/90; 330/207 P
[58] Field of Search ................ 330/207 P; 361/90, 98, 361/106

[56] References Cited

U.S. PATENT DOCUMENTS

| 3,691,427 | 9/1972 | Honda et al. ........................... 361/90 |
| 3,965,295 | 6/1976 | Evans et al. ......................... 361/90 X |
| 4,034,268 | 7/1977 | Klauck ......................... 330/207 P X |

*Primary Examiner*—Jr. Moose
*Attorney, Agent, or Firm*—Hill, Van Santen, Steadman, Chiara & Simpson

[57] ABSTRACT

An unbalanced DC voltage detecting circuit which includes first and second switching transistors with one connected to the output terminal of a power amplifier through a low pass filter and the other connected to the output terminal through a DC level shifting device and the low pass filter with the outputs of the first and second transistors connected to a third switching transistor which controls current to a relay such that when said third transistor is turned off, the relay is deenergized to open a circuit to a load. The first and second transistors are controlled by unbalanced DC voltage which exceeds predetermined levels.

A second embodiment includes temperature control to prevent overheating.

14 Claims, 3 Drawing Figures

UNBALANCED DC VOLTAGE DETECTING CIRCUIT

BACKGROUND OF THE INVENTION

1. Field of the Invention

The present invention relates in general to unbalanced DC voltage detecting circuits, for example, for protecting loudspeakers and in particular to an unbalanced DC voltage detecting circuit that might be constructed as an integrated circuit.

2. Description of the Prior Art

It is generally known in the art in output amplifiers such as output transformer-less amplifiers for a double-power source system in which positive and negative voltage sources are used wherein a DC power source is connected to a load such as a speaker and wherein when the DC component of the output signal from the output amplifier is unbalanced for some reason, that such large unbalanced DC voltage will flow through the load and destroy it.

Therefore in the prior art, there has been proposed to provide an unbalanced DC voltage detecting circuit for an output amplifier of a double-power source system in which a positive power source $+E$ and a negative power source $-E$ of the type shown in FIG. 1. As illustrated in FIG. 1, a transistor output transformer-less OTL amplifier which is operated from two power sources, $+E$ and $-E$ is designated by numeral 1 and comprises a pair of transistor amplifiers 1a connected to the $+E$ bus and a pair of transistors designated 1b connected to the $-E$ bus; 1c connected to the bases of one of the transistors 1a and 1b and comprises the input terminal. An output terminal 1d of the transistor OTL amplifier 1 is connected to the emitters of the transistors 1a through emitter resistors and is also connected to the emitter of one of the transistors 1b through an emitter resistor and is connected to the collector of the second transistor 1b as illustrated. Output terminal 1d is connected through an on-off switch 2 to the load 3 which might, for example, be a speaker. The switch 2 is controlled by a relay 11. A low-pass filter comprising a resistor 4 and a capacitor 5 is also connected to the output terminal 1d so as to detect the DC component from the output signal. The DC component is detected at terminal S between the resistor 4 and 5 and is applied to the emitter of an NPN transistor 6 which has its base connected to ground and its collector connected to resistors 8 and 9 to the positive bus terminal $+E$. Terminal S is also connected to the base of an NPN transistor 7 which has its emitter connected to ground and its collector connected to the collector of transistor 6. The junction point between the resistors 8 and 9 is connected to the base of a PNP transistor 10 which has its emitter connected to the positive power source $+E$ and which has its collector connected to one side of a relay coil 11 that controls the relay switch 2. The other side of the relay coil is connected to ground and the relay coil is shorted by a diode.

The prior art unbalanced DC voltage detecting circuit illustrated in FIG. 1 operates as follows: when the output amplifier 1 has a normal load, the unbalanced DC current which is applied to the load 3 will be very small. Thus, the transistors 6 and 7 will be in the non-conductive state and the relay 11 will be deenergized and the transistor 10 will be in the OFF condition. The switch 2 is closed and the load 3 will be connected when the relay 11 is deenergized. In the event that the DC component in the output signal from the amplifier 1 which comprises the DC voltage appearing at output terminal S of the low-pass filter exceeds a base emitter voltage $V_{BE}$ of the transistors 6 and 7 and if the voltage at the output terminal S is negative, the transistor 6 will be turned ON. When this occurs, current will flow from positive power source $+E$ through resistors 9 and 8 through the collector-emitter path of the transistor 6, resistor 4, the relay switch 2 and the load 3 to ground. As a result of this current, a voltage drop will occur across the resistor 9 which will turn transistor 10 ON which allows current to pass from the $+E$ bus through the emitter-collector path of transistor 10 through the relay coil 11 to ground. When the relay 11 is energized, it will open the switch 2 thus disconnecting the load 3 from the output terminal 1d of the amplifier 1. On the other hand, if the voltage at the output terminal S goes positive, the transistor 7 will be turned ON and current will flow from the positive power source $+E$ through the resistors 8 and 9 and the collector-emitter path of transistor 7 to ground which will bias the base of transistor 10 to a voltage which turns it ON, thus energizing the relay 11 and opening the switch 2 to disconnect the load 3.

Although with prior art circuits such as shown in FIG. 1 satisfactory operation occurs, however, the transistor 10 operates with, for example, the positive power source $+E$ as a reference so that if this circuit is employed to protect transistors of the output amplifier 1 and to avoid click noises when the power source is turned ON and OFF, the construction of the circuit becomes very complicated. This is true especially if the circuit is constructed as an integrated circuit since the power source voltage may vary arbitrarily and the circuit of the prior art cannot be efficiently used.

SUMMARY OF THE INVENTION

It is an object of the present invention to provide an unbalanced DC voltage detecting circuit which is free from the defects inherent in the prior art circuit.

Another object of the present invention is to provide an unbalanced DC voltage detecting circuit which can be constructed as an integrated circuit.

According to the present invention, an unbalanced DC voltage detecting circuit is provided which comprises a signal input circuit having an output terminal wherein when an unbalanced DC voltage occurs, it is supplied by a low-pass filter to first and second switching circuits with the first switching circuit connected to the output terminal through a low-pass filter and the second switching circuit connected to the output terminal through a low pass filter and a DC level shifter, and means are provided for protecting the load when the DC level is outside of a predetermined voltage range.

Other objects, features and advantages of the present invention will become apparent from the following description taken in conjunction with the accompanying drawings in which like references designate like elements.

DESCRIPTION OF THE PREFERRED EMBODIMENTS

Figure 1:
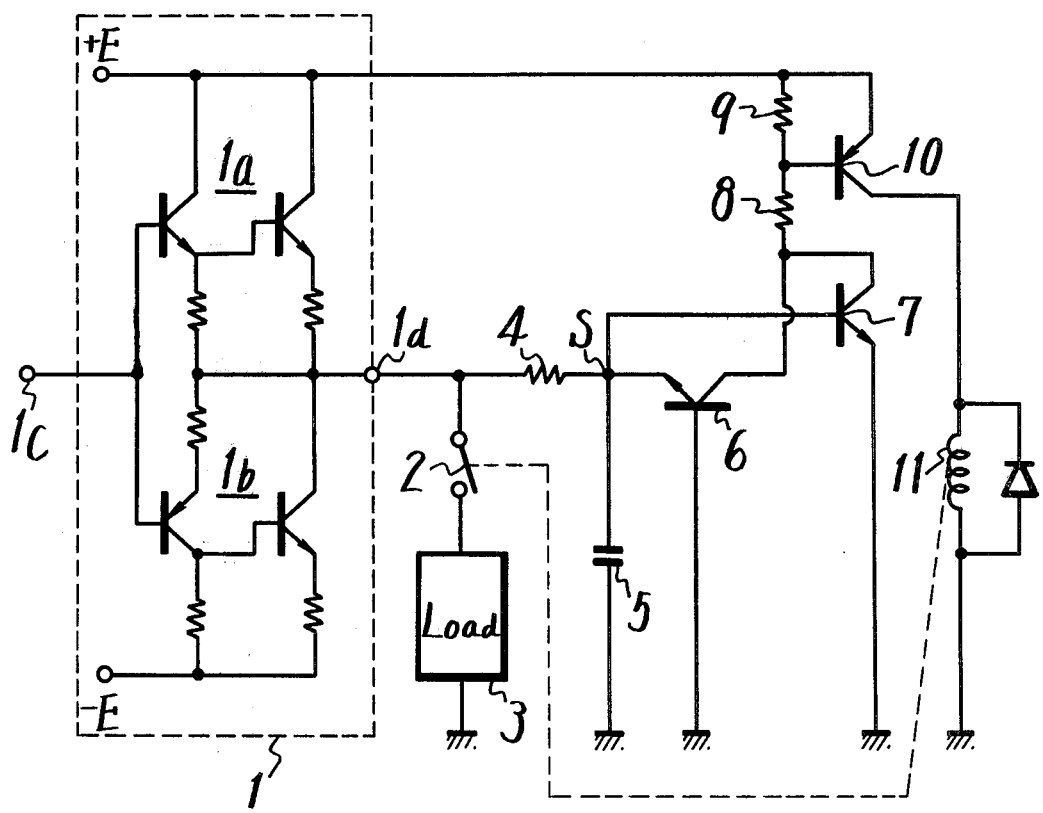
FIG. 1 is an electrical circuit diagram illustrating a prior art unbalanced DC voltage detecting circuit.
Figure 2:
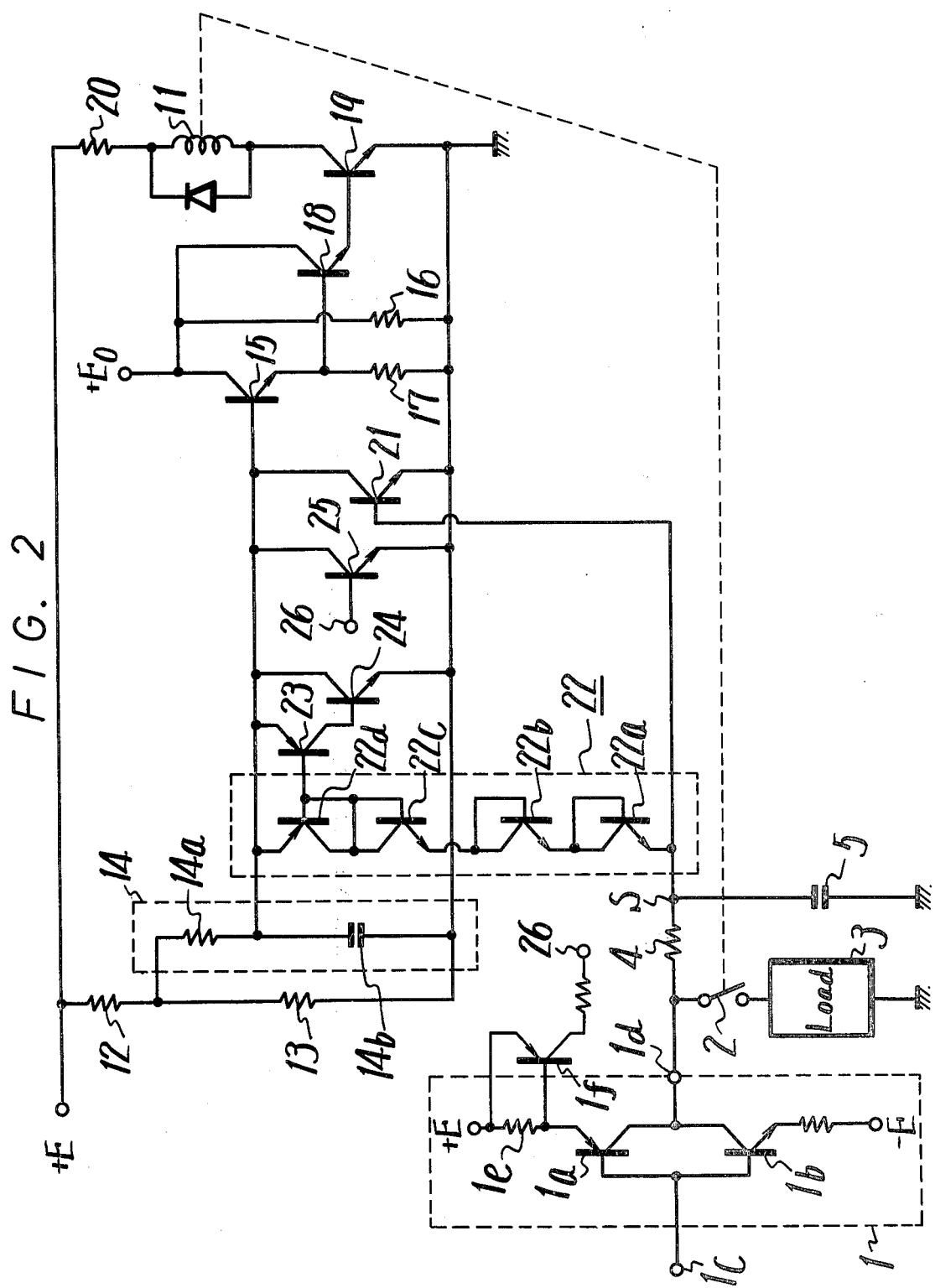
FIG. 2 illustrates the unbalanced DC voltage detecting circuit of the invention.

FIG. 2 illustrates amplifier 1, including a pair of transistors 1a and 1b with their bases connected to an input terminal 1c, and emitters of the transistors 1a and 1b connected through resistors to the positive and negative voltage sources +E and −E respectively. The output terminal 1d is connected to the ON-OFF switch 2 which connects the load such as the speaker to the output of the amplifier. The other side of the load is connected to ground. The low pass filter comprises a resistor 4 and a capacitor 5 connected as shown in the output of the filter is designated by a terminal S.

The positive power terminal +E is connected to ground through a pair of resistors 12 and 13, and a time constant circuit comprising the resistor 14a and the capacitor 14b is connected between ground and the junction point between the resistors 12 and 13. The time constant of the time constant circuit 14 has a sufficient time delay so as to prevent click noises from occurring when the power source is turned ON. The junction point between the resistor 14a and the capacitor 14b is connected to the base of a NPN transistor 15, which has its collector connected to a positive DC power source $+E_O$ which is lower in voltage than the positive power source +E. The positive DC power source $+E_O$ can be provided from a tertiary winding of a power source transformer not shown, or may be provided from a middle tap on the secondary winding of the power source transformer from which the positive power source +E is obtained. The voltage thus obtained is rectified by a rectifier not shown and smoothed so as to provide the desired positive DC power source which is lower in voltage than the positive power source +E. The emitter of transistor 15 is connected to ground through a resistor 17 and the collector of transistor 15 is connected to ground through a resistor 16. The resistor 16 may be utilized for discharging a smoothing capacitor not shown, provided at the output side of the rectifier circuit which is provided for developing the positive DC power source voltage $+E_O$. The emitter of transistor 15 is connected to the base of an NPN transistor 18 which has its collector connected to the power source $+E_O$ and its emitter connected to the base of a NPN transistor 19 which has its emitter connected to ground and its collector connected to a relay 11 which has its other side connected through a resistor 20 to the positive power source +E. The relay 11 controls the position of switch 2 and the switch 2 is closed when the relay coil 11 is energized and the switch 2 is open when relay coil 11 is deenergized. The output terminal S of the low pass filter is connected to the base of an NPN transistor 21 which has its emitter connected to ground and its collector connected to the base of transistor 15. Transistor 21 comprises a switching transistor for the transistor 15. The output terminal S of the low pass filter is also connected to the input transistor 22a of a level shifting circuit 22 capable of shifting the voltage level by 4 $V_{BE}$. The transistors 22a, 22b, 22c and 22d are connected as shown and the emitter of transistor 22d is connected to the junction point between the resistor 14a and 14b. The level shifter 22 includes three NPN transistors 22a, 22b, and 22c and a PNP transistor 22d, each of which is connected as a diode with the base connected to the emitter. The shifting level of the level shifter circuit 22 is determined by the number of transistors, such as transistors 18 and 19 which follow the switching transistor 15.

The collector and base of transistor 22d is connected to the base of transistor 23 which has its emitter connected to connection point between resistor 14a and capacitor 14b of the time constant circuit 14. The collector of transistor 23 is connected to the base of a NPN transistor 24 which serves as a switching transistor and has its emitter connected to ground and its collector connected to the junction point between the resistor 14a and the capacitor 14b.

An NPN transistor 25 has its collector connected to the junction point between resistor 14a and capacitor 14b and its base is connected to a control signal input terminal 26 which receives a control signal from transistor 1f through a collector resistor. The transistor 1f has its emitter connected to the positive voltage terminal +E and its base connected to the junction point between the resistor 1e and the emitter of transistor 1a as shown.

The circuit of the invention illustrated in FIG. 2 operates such that under normal conditions, the transistor 15 is conductive and the transistors 18 and 19 conduct when the transistor 15 conducts and current flows through the relay coil 11 from the positive voltage source +E and the resistor 20 through the collector-emitter path of transistor 19 to ground. At this time when the relay 11 is energized, it will close switch 2 so that power will be supplied to the load 3. The circuit will continue operation with the relay coil 11 energized when the DC component of the output signal of the output amplifier at terminal S is higher than $-V_{BE}$ but lower than $+V_{BE}$.

When the DC voltage at the output terminal S becomes higher than $+V_{BE}$, transistor 21 will be turned ON which will drop the voltage on the base of transistor 15 substantially to ground, which will turn OFF transistor 15 which, in turn, turns OFF transistors 18 and 19 thus interrupting current through the relay coil 11, so that it is deenergized and relay switch will open to protect the load.

Since the DC voltage at the connection point between the resistor 14a and the capacitor 14b of the time constant circuit is numeral 3 $V_{BE}$ which is determined by the base-emitter voltages of the transistors 15, 18 and 19, when the voltage at the output terminal S of the low pass filter goes lower than $-V_{BE}$, the transistors 22a, 22b, 22c and 22d forming the level shifter circuit will become conductive and thus current flows through these transistors which will turn transistor 23 ON and transistor 23, when conductive, turns transistor 24 ON. This drops the voltage on the base of the transistor 15 turning it OFF and, consequently, transistors 18 and 19 will also be turned OFF thus deenergizing the relay coil 11 so that switch 2 will also be open to protect the load 3.

The invention of FIG. 2 also provides that the output current of the amplifier 1 at transistor 1a is detected and transistor 25 will be rendered conductive when the detected current is too large. For this purpose, the PNP transistor 1f is normally OFF, but when the current to transistor 1a becomes too large, the transistor 1f is turned ON which supplies through the resistor an input to input terminal 26 to bias transistor 25 to the conductive state thus turning transistor 15 OFF as well as transistors 18 and 19 deenergizing relay coil 11 so as to open switch 2.

In the invention illustrated in FIG. 2, when power is initially supplied, the transistor 15 becomes conductive after the time interval determined by the time constant circuit 14 and the relay coil 11 will be energized after this time constant and close the relay switch 2. Thus the clicking noises can be avoided when power is applied. When power is not applied to the circuit, the voltage of the DC power source $E_O$ is low and the electrical charge on this smoothing capacitor for providing the power $E_O$ can be rapidly discharged. Therefore the clicking noise will not occur when power is not applied.

In the circuit described above, since the transistors 15, 18 and 19 are operated with ground potential as a reference, it is possible that the transistor of the output amplifier can be prevented from being damaged by the excess current providing that the switching element such as the transistor 25 between the base of the transistor 15 and ground be of very simple circuit construction. When the amplifier circuit is constructed as an integrated circuit, since the power source voltage is arbitrarily varied, the circuit of the invention can be effectively constructed and operated.

Figure 3:
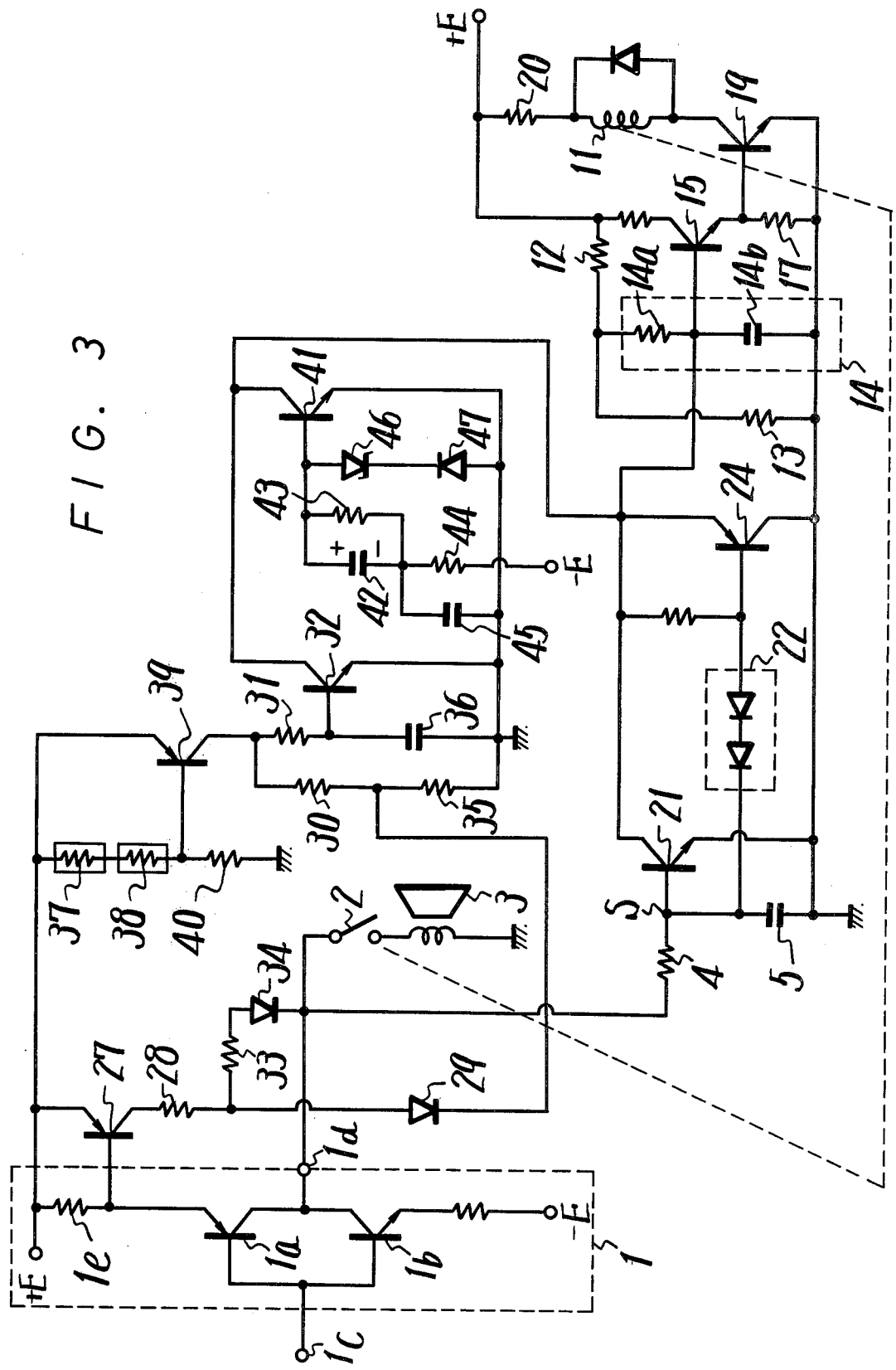
FIG. 3 illustrates a modification of the invention.

FIG. 3 illustrates a modification of the invention in which the same elements illustrated in FIG. 2 are designated with the same references.

In the example illustrated in FIG. 3, the emitter of PNP transistor 1a of the amplifier 1 has its emitter connected to the resistor 1e which has its other side connected to the positive voltage terminal +E. The emitter of transistor 1a is connected to the base of PNP transistor 27 which has its emitter connected to +E and its collector connected to a resistor 28 which has its other side connected to a diode 29, forward connected, and through resistors 30 and 31 to the base of NPN transistor 32. The connection point between resistor 28 and diode 29 is connected through a series resistor 33 and a forward connected diode 34 to output terminal 1d of the output amplifier 1 and these components prevent erroneous operation of the circuit. The connection point between diode 29 and resistor 30 is connected to ground through a resistor 35. The base of transistor 32 is connected to ground through a capacitor 36, and the resistor 31 and capacitor 36 form a time constant circuit. The emitter of transistor 32 is connected to ground and the collector of transistor 32 is connected to the base of switching transistor 15. When the output current from the amplifier 1 is within ordinary ranges, transistor 27 will be non-conductive, however, when the output current becomes too high, the transistor 27 will be biased to the ON state and current will be applied to the transistor 27 to the base of transistor 32 to turn it ON which, when conductive, will turn OFF transistor 15 and the relay coil 11 will be deenergized which will open switch 2 to protect the load 3. Thus, when excessive current occurs, the load such as a speaker 3 and the output transistors 1a and 1b will be protected.

A pair of posistors 37 and 38 are connected in series with a resistor 40 and connected between the positive voltage source +E and ground. The junction point between posistor 38 and the resistor 40 is connected to the base of a PNP transistor 39. The emitter of transistor 39 is connected to the +E voltage source and the collector is connected through a resistor 31 to the base of transistor 32. The transistor 39 will be non-conductive under normal operating conditions. However, when the temperature of the transistors 1a and 1b of the output amplifier 1 exceed a predetermined value, the resistant value of the posistors 37 and 38 will exceed predetermined resistive values which will cause the transistor 39 to be turned ON and current will be applied through transistor 39 to the base of transistor 32 to turn transistor 32 ON which will cause the transistor 15 to be rendered non-conductive, thus deenergizing relay coil 11 so that relay switch 2 will be opened. Thus, the transistors 1a and 1b of the output amplifier will be protected when their temperatures become too high and thus will be prevented from being damaged.

In FIG. 3 there is also provided a NPN transistor 41 which has its base connected to the negative power source −E through a series resistor 44 and a parallel circuit comprising a capacitor 42 and a resistor 43. The connection point between the resistors 43 and 44 is connected to ground through a capacitor 45. The transistor 41 has its base grounded through the series connection of a Zener diode 46 and a diode 47 which chokes reverse current. The collector of transistor 41 is connected to the base of switching transistor 15. With this circuit, when power is applied, the capacitor 42 is charged with the polarity as shown in FIG. 3 with the side of the capacitor 42 connected to the base 41 being positive. Charging occurs through the grounded diode 47, the Zener diode 46, the capacitor 42, the resistor 44, and the negative power source −E. Since the negative terminal of the capacitor 42 is at a potential determined by the negative power source −E, the transistor 41 will be non-conductive. When the power source is turned OFF, the negative power source −E disappears and the transistor 41 will become conductive due to the discharging current from the capacitor 42 at the same time when the power source is turned OFF with the result that transistor 15 will be rendered non-conductive and relay coil 11 will be deenergized thus opening the relay switch 2 protecting the load. This will prevent clicking noises from the power source occurring when the power source is turned OFF.

It is to be realized that the other elements of the invention illustrated in FIG. 3 are constructed similar to those illustrated in FIG. 2 and their operation will not be repeated.

It will be apparent that many modifications and variations can be effected by one skilled in the art without departing from the spirit and scope of the novel concepts of the present invention and the spirit and scope of the invention is to be determined by the appended claims.

I claim as my invention:

1. An unbalanced DC voltage detector comprising:
   (a) signal input means having an output terminal at which an unbalanced DC voltage can occur,
   (b) a low pass filter connected to said output terminal of said signal input means,
   (c) first and second switching transistor means,
   (d) means for connecting said first switching transistor means to said low pass filter;
   (e) a DC level shifter,
   (f) means for connecting said second switching transistor means to said low pass filter through said DC level shifter, and
   (g) detecting means connected to said first and second switching transistor means so as to produce a control signal when the unbalanced DC voltage exceeds a predetermined value.

2. An unbalanced DC voltage detector according to claim 1, in which said detecting means includes at least a third switching transistor which is controlled by the outputs of said first and second switching transistor means so as to produce said control signal.

3. An unbalanced DC voltage detector according to claim 2, in which said DC level shifter comprises a plurality of diode connected transistors.

4. An unbalanced DC voltage detector according to claim 3, in which said detecting means further includes a relay controlled by the control signal of said third switching transistor.

5. An unbalanced DC voltage detector according to claim 4, in which the output terminal of said signal input means is the output terminal of a power amplifier and said relay controls the connection between the output terminal and a load in response to the control signal of said third switching transistor.

6. An unbalanced DC voltage detector comprising:
 (a) signal input means adapted to be connected to the output terminal of a power amplifier,
 (b) a low pass filter comprising a series connected first resistor and a first capacitor, said low pass filter connected between said signal input means and a voltage reference point,
 (c) a first switching transistor having a base, emitter, and collector, the base and emitter of which are connected across the capacitor of said low pass filter and the collector of which is connected to a DC voltage source,
 (d) a second switching transistor having a base, emitter, and collector, the collector and emitter of which are connected between said DC voltage source and said voltage reference point,
 (e) a DC level shifter connected between the base of said second switching transistor and the connection point between said first resistor and first capacitor, and
 (f) a third switching transistor having a base, emitter and collector, the base of which is connected to the collectors of said first and second switching transistors and a control signal produced on its collector in response to switching operation.

7. An unbalanced DC voltage detector according to claim 6, in which said DC level shifter comprises a plurality of diode-connected transistors.

8. An unbalanced DC voltage detector according to claim 7, further including a relay having a relay coil connected to the collector of said third switching transistor and a relay switch connected between the output terminal and a load.

9. An unbalanced DC voltage detector according to claim 8, in which said second switching transistor comprises a Darlington connection of a pair of transistors.

10. An unbalanced DC voltage detector according to claim 8, in which the base of said third switching transistor is connected to said DC voltage source through a second capacitor which comprise a time constant circuit to determine the time delay between when a power switch is turned ON.

11. An unbalanced DC voltage detector according to claim 8, further including:
 (a) a fourth switching transistor having base, emitter and collector, the collector and emitter of which are connected between the base and emitter of said third switching transistor;
 (b) means for detecting overload current flowing through the power amplifier transistor; and
 (c) means for connecting the output of said overload current detecting means to the base of said fourth switching transistor so as to turn on said fourth switching transistor when an overload current state exists.

12. An unbalanced DC voltage detector according to claim 11, in which said overload current detecting means comprises a third resistor connected in the output current path of said power amplifier and a fifth switching transistor having base, emitter and collector, the base and emitter of which are connected across said third resistor and the collector of which is connected to the base of said fourth switching transistor.

13. An unbalanced DC voltage detector according to claim 6, including a fourth switching transistor with its collector connected to the base of said third switching transistor, a posistor mounted so to respond to temperature variations of said power amplifier connected to said fourth switching transistor.

14. An unbalanced DC voltage detector according to claim 13 including means for turning off said third switching transistor when the negative DC voltage source is turned off.

* * * * *